(12) United States Patent
Suh et al.

(10) Patent No.: US 8,698,271 B2
(45) Date of Patent: Apr. 15, 2014

(54) GERMANIUM PHOTODETECTOR AND METHOD OF FABRICATING THE SAME

(75) Inventors: Dongwoo Suh, Daejeon (KR); Sang Hoon Kim, Seoul (KR); Gyungock Kim, Seoul (KR); JiHo Joo, Goyang (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 342 days.

(21) Appl. No.: 12/404,275

(22) Filed: Mar. 13, 2009

(65) Prior Publication Data

US 2010/0102412 A1     Apr. 29, 2010

(30) Foreign Application Priority Data

Oct. 27, 2008  (KR) .................. 10-2008-0105199

(51) Int. Cl.
*H01L 33/00*  (2010.01)
*H01L 21/20*  (2006.01)

(52) U.S. Cl.
USPC ............... 257/461; 257/E33.035; 257/E21.09

(58) Field of Classification Search
USPC ............... 257/461, E33.035, E21.09; 438/97
See application file for complete search history.

(56) References Cited

U.S. PATENT DOCUMENTS

| | | | |
|---|---|---|---|
| 6,130,144 A * | 10/2000 | Verret ........................... | 438/542 |
| 6,693,298 B2 | 2/2004 | Eisenbeiser et al. | |
| 6,699,764 B1 * | 3/2004 | Tweet et al. ................... | 438/305 |
| 7,138,697 B2 | 11/2006 | Chu et al. | |
| 7,196,400 B2 * | 3/2007 | Yamazaki et al. ............ | 257/627 |
| 7,259,084 B2 | 8/2007 | Chang et al. | |
| 7,288,825 B2 * | 10/2007 | Rafferty et al. ............... | 257/436 |
| 7,642,179 B2 * | 1/2010 | Ikeda et al. ................... | 438/509 |
| 7,682,947 B2 * | 3/2010 | Brabant et al. ................ | 438/481 |
| 2007/0134901 A1 | 6/2007 | Chang et al. | |
| 2008/0164493 A1 * | 7/2008 | Bedell et al. .................. | 257/192 |
| 2008/0185618 A1 | 8/2008 | Chu et al. | |

FOREIGN PATENT DOCUMENTS

| | | |
|---|---|---|
| JP | H11-224953 A | 8/1999 |
| JP | 2005527097 | 9/2005 |
| JP | 2006-100611 A | 4/2006 |
| KR | 100393955 B1 | 7/2003 |
| KR | 1020040017833 A | 2/2004 |
| KR | 1020070028311 A | 3/2007 |
| TW | I221001 | 9/2004 |
| WO | WO 03/009357 A2 | 1/2003 |
| WO | WO 2004/001857 A1 | 12/2003 |
| WO | WO 2005/083750 A2 | 9/2005 |

OTHER PUBLICATIONS

Dongwoo Suh et al., "35 GHz Ge p-i-n Photodetectors Implemented Using RPCVD," 5th IEEE International Conference on Group IV Photonics, Sep. 17-19, 2008, pp. 191-193.
M. Jutzi et al., "Ge-on-Si Vertical Incidence Photodiodes With 39 GHz Bandwidth," IEEE Photonics Technology Letters, Jul. 2005, pp. 1510-1512.

* cited by examiner

*Primary Examiner* — Matthew W Such
*Assistant Examiner* — Monica D Harrison (57) ABSTRACT

Provided is a germanium photodetector having a germanium epitaxial layer formed without using a buffer layer and a method of fabricating the same. In the method, an amorphous germanium layer is formed on a substrate. The amorphous germanium layer is heated up to a high temperature to form a crystallized germanium layer. A germanium epitaxial layer is formed on the crystallized germanium layer.

16 Claims, 9 Drawing Sheets

GERMANIUM PHOTODETECTOR AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2008-0105199, filed on Oct. 27, 2008, the entire contents of which are hereby incorporated by reference.

BACKGROUND OF THE INVENTION

The present invention disclosed herein relates to a photodetector and a method of fabricating the same, and more particularly, to a germanium photodetector and a method of fabricating the same.

Recent silicon-based optical communication technology uses germanium in both of the active device and passive device applications. Because the band gap energy (0.67 eV) of the germanium is smaller than the band gap energy (1.12 eV) of the silicon, the germanium can detect generic optical communication wavelengths $\lambda$ of 1.3 µm to 1.6 µm that cannot be detected by the silicon. However, the germanium has a lattice constant difference of 4% from the silicon. Therefore, it is difficult to grow a low-defect germanium epitaxial layer directly on a silicon substrate. There is a method of fabricating a p-i-n detector by forming a SiGe buffer layer between the silicon substrate and the germanium epitaxial layer. However, the buffer layer has many inherent crystal defects, and the buffer layer must be thick enough to grow the germanium epitaxial layer. Therefore, the buffer layer degrades the detector's performance and also imposes many restrictions on the fabrication process. There is a method of forming the germanium epitaxial layer on the silicon substrate through an ultra-high vacuum process of $10^{-9}$ torr or less, such as ultra-high vacuum chemical vapor deposition (UHVCVD) or molecular beam epitaxy (MBE), without using the buffer layer. This method, however, requires a high-temperature annealing process of 700° C. or more in order to reduce crystal defects such as dislocations. Thus, due to the high-temperature annealing process, the method is low in productivity and has a limitation in mass production.

SUMMARY OF THE INVENTION

The present invention provides a photodetector with a germanium epitaxial layer and a method of fabricating the same.

In some embodiments of the present invention, methods of fabricating a germanium photodetector include: forming an amorphous germanium layer on a substrate at a first temperature; crystallizing the amorphous germanium layer while heating from the first temperature to a second temperature; and forming a germanium epitaxial layer on the crystallized germanium layer.

In some embodiments, the forming of the germanium epitaxial layer on the crystallized germanium layer is performed at the second temperature, or during the heating from the first temperature to the second temperature.

In other embodiments of the present invention, germanium photodetectors include: a germanium epitaxial layer disposed directly on a substrate; a first doped layer on the germanium epitaxial layer; and a second doped layer disposed on the substrate or under the germanium epitaxial layer, the second doped layer having a different conductivity type from the first doped layer.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

It will be understood that when a layer (or film) is referred to as being 'on' another layer or substrate, it can be directly on the other layer or substrate, or intervening layers may also be present. Also, though terms like a first, a second, and a third are used to describe various regions and layers in various embodiments of the present invention, the regions and the layers are not limited to these terms. These terms are used only to tell one region or layer from another region or layer.

FIGS. 1 to 3 and 6 to 8 are cross-sectional views illustrating a method of fabricating a germanium photodetector according to some exemplary embodiments of the present invention.

Figure 1:
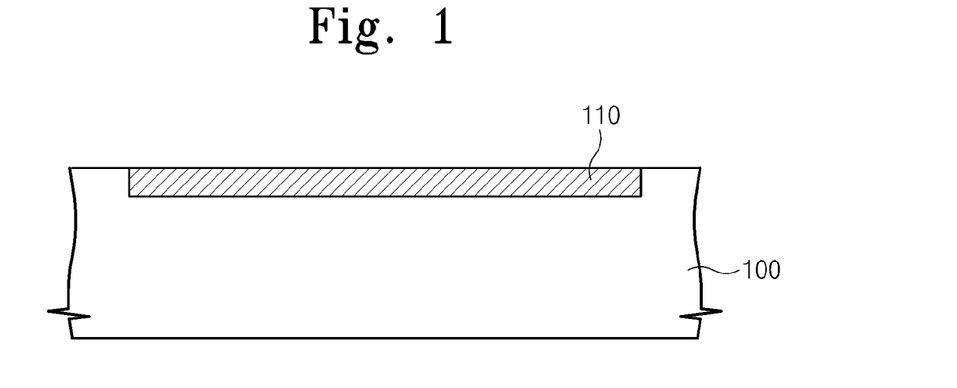
FIGS. 1 to 3 and 6 to 8 are cross-sectional views illustrating a method of fabricating a germanium photodetector according to some exemplary embodiments of the present invention.

Referring to FIG. 1, a first doped layer 110 is formed on a substrate 100. The substrate 100 may include a semiconductor-based structure with a silicon surface. The semiconductor-based structure may be a silicon layer, a silicon-on-insulator (SOI) layer, or a silicon epitaxial layer based on a semiconductor structure. The substrate 100 may be a substrate where an insulating layer or a conductive layer is formed. In an embodiment, an n-type or p-type first doped layer 10 is formed on the substrate 100 through an ion implantation or diffusion process. For example, the first doped layer 110 may have a doping concentration of about $5 \times 10^{20}/cm^3$.

Figure 2:
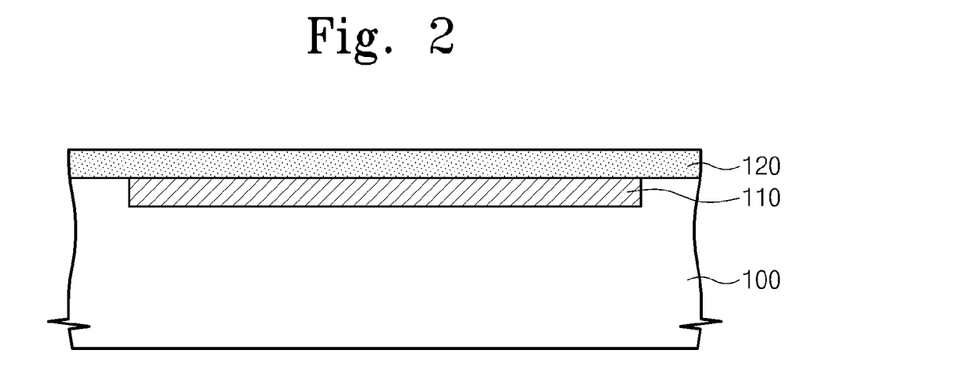

Referring to FIG. 2, an amorphous germanium layer 120 is formed on the first doped layer 110. To this end, for example, $GeH_4$ gas is introduced to the substrate 100. Herein, the substrate 100 may maintain a low temperature of about 300° C. to about 500° C. under a pressure of about 1 torr to about 300 torr. The GeH$_4$ gas is decomposed into germanium and H$_2$ gas, and the germanium is deposited onto the substrate 100 to form a germanium layer with a very small thickness of about 300 nm or less. The very small thickness can be achieved because the deposition rate is low. Due to the low substrate temperature, the germanium layer grows into an amorphous state on the substrate 100.

Figure 3:
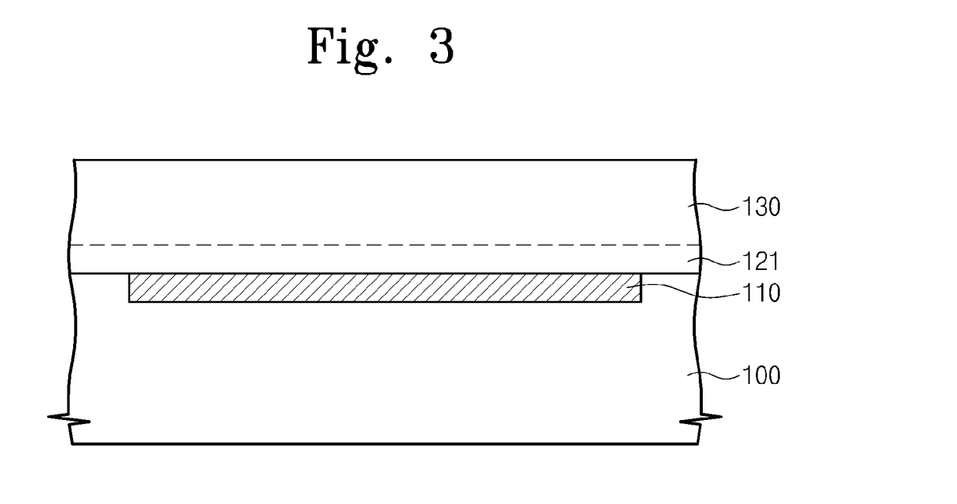

Referring to FIG. 3, the substrate 100 is heated up to a high temperature of about 600° C. to about 700° C. During the heating process, at least a portion of the amorphous germanium layer 120 may be crystallized to form a crystallized germanium layer 121. During or after the heating process, reaction gas GeH$_4$ is introduced onto the substrate 100 to form a germanium epitaxial layer 130. The crystallization and the growth of the germanium epitaxial layer 130 may be performed under a pressure of about 1 torr to about 300 torr. The resulting germanium epitaxial layer 130 reduces a stress due to a lattice constant difference with the substrate 100, thus making it possible to omit a additional buffer layer or a additional annealing process. Accordingly, the germanium epitaxial layer 130 deposited on the crystallized germanium layer 121 can grow epitaxially due to the homogeneous elements. Consequently, it is possible to reduce lattice defects due to a lattice constant difference between the germanium epitaxial layer 130 and the substrate 100.

Figure 4A:
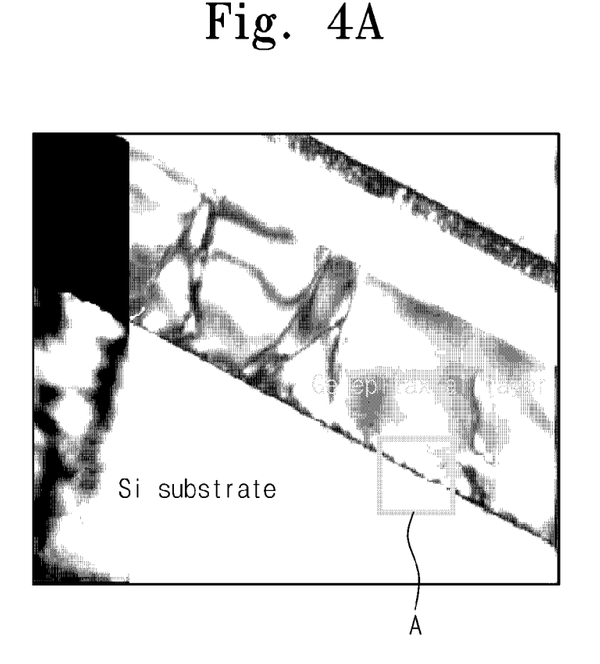
FIG. 4A is a transmission electron microscope (TEM) image of an interface of a germanium epitaxial layer formed on a substrate according to exemplary embodiments of the present invention.
Figure 4B:
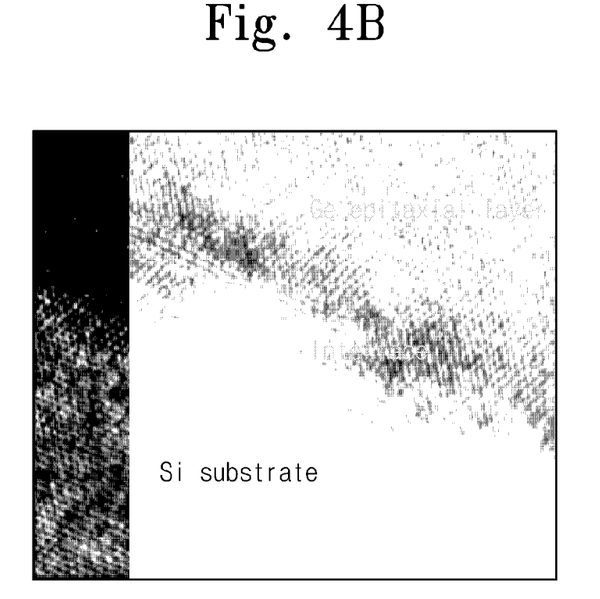
FIG. 4B is an expanded view of a portion A of FIG. 4A.

FIG. 4A is a transmission electron microscope (TEM) image of an interface of the germanium epitaxial layer 130 formed on the substrate 100; and FIG. 4B is an expanded view of a portion A of FIG. 4A. It can be seen from FIGS. 4A and 4B that the germanium epitaxial layer 130 has grown to a thickness of about 1.3 μm from the crystallized germanium layer 121 that was formed to a thickness of about 0.1 μm on the substrate 100. The germanium epitaxial layer 130 has a low threading dislocation density of about $2\times10^6$/cm$^2$ measured by Secco etching. Most of the germanium atoms were coherently deposited on the silicon atoms of the substrate 100. By the threading dislocation, the crystallized germanium layer 121 reduces a lattice constant difference (i.e., a lattice mismatch) of about 4% between the silicon and the germanium.

Figure 5:
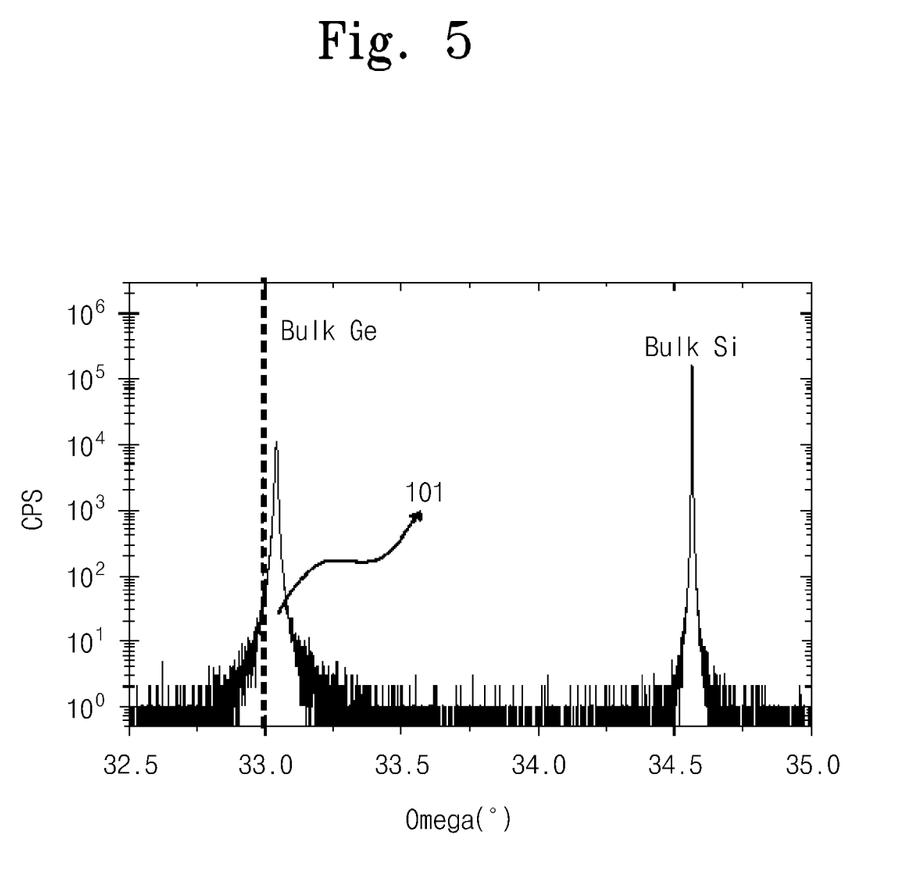
FIG. 5 is a graph illustrating the X-ray diffraction characteristics of a germanium epitaxial layer formed on a substrate according to exemplary embodiments of the present invention.

FIG. 5 is a graph illustrating the X-ray diffraction characteristics of the germanium epitaxial layer 130 formed on the substrate 100. A peak 101 of FIG. 5 represents a diffraction crystal plane of the germanium epitaxial layer 130 formed on the substrate 100. It can be seen from FIG. 5 that the germanium epitaxial layer 130 has grown into an epitaxial crystalline structure without other polycrystalline structures.

Figure 6:
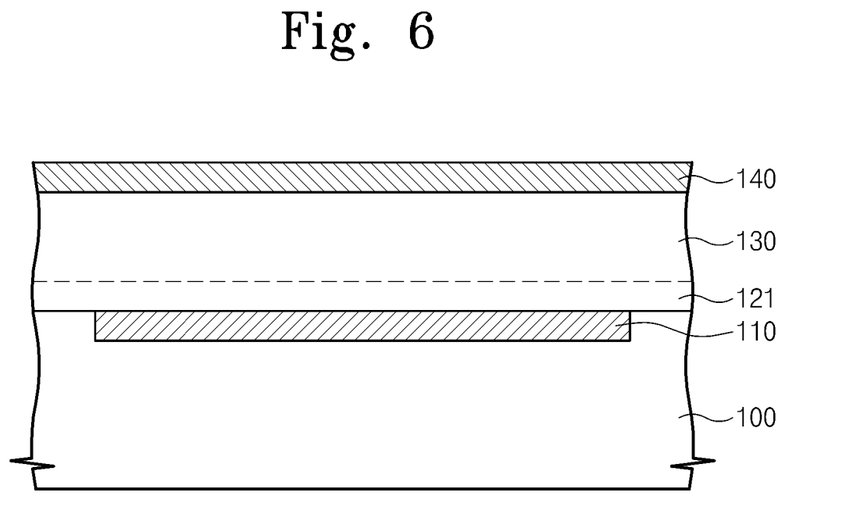

Referring to FIG. 6, a second doped layer 140 is formed on the germanium epitaxial layer 130. In an embodiment, the second doped layer 140 may be formed by introducing n-type or p-type impurity elements to the germanium epitaxial layer 130. In another embodiment, the second doped layer 140 may be formed by depositing n-type or p-type doped silicon or polysilicon on the germanium epitaxial layer 130. For example, the second doped layer 140 may have a doping concentration of about $1\times10^{19}$/cm$^3$. The second doped layer 140 has a different conductivity type from the first doped layer 110, thus forming a p-i-n detector.

Figure 7:
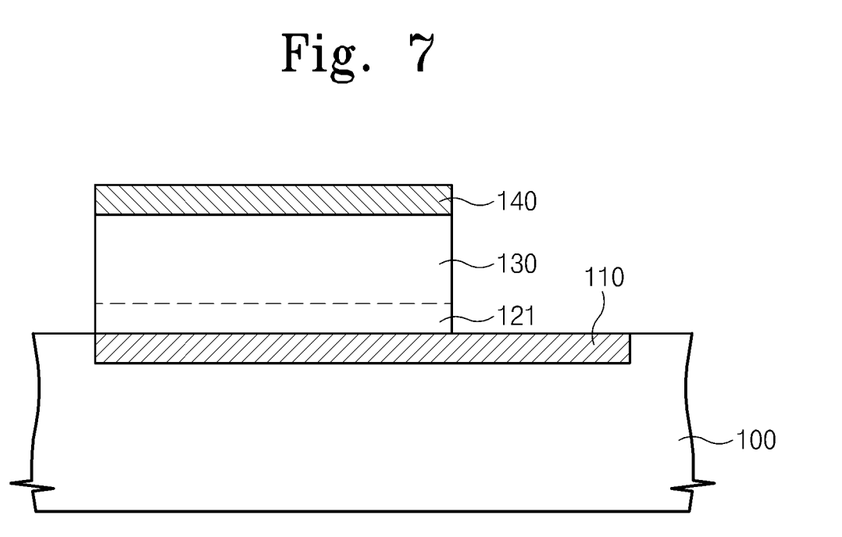
Figure 8:
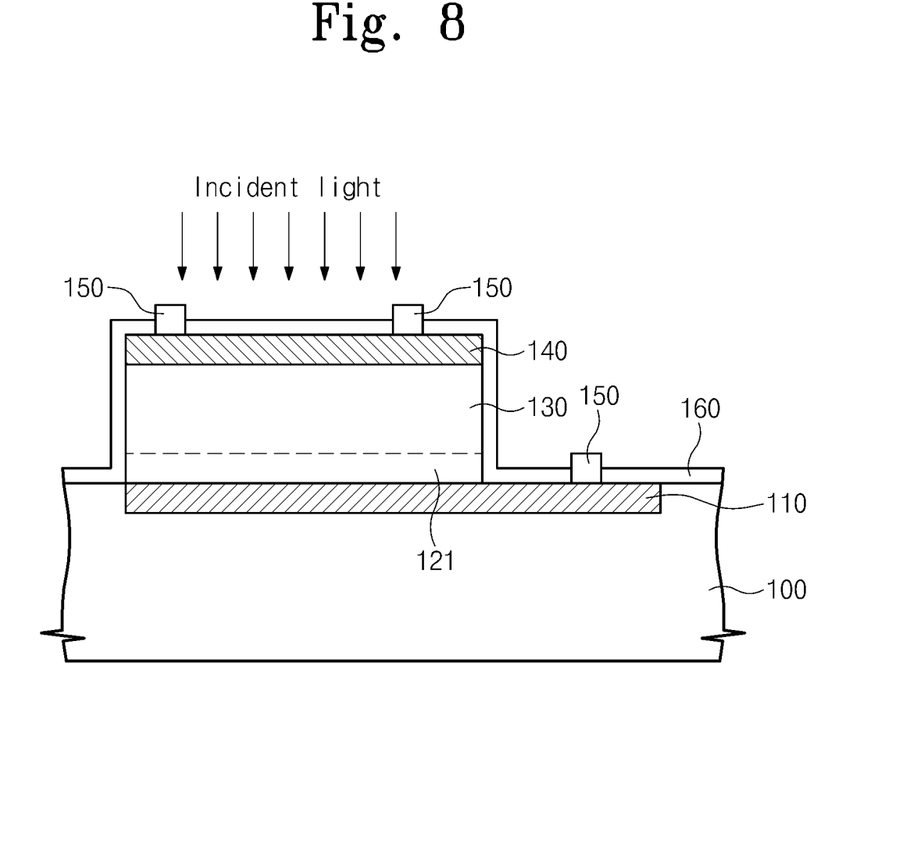

Referring to FIGS. 7 and 8, the crystallized germanium layer 121, the germanium epitaxial layer 130, and the second doped layer 140 are anisotropically etched and patterned to expose the first doped layer 110. An insulating passivation layer 160 is formed on the resulting structure. The insulating passivation layer 160 may be formed of an oxide, a nitride, or a nitric oxide. A portion of the insulating passivation layer 160 is etched to expose the first doped layer 110 and the second doped layer 140. An electrode 150 is formed on the exposed portion.

FIGS. 9 to 13 are cross-sectional views illustrating a method of fabricating a germanium photodetector according to other exemplary embodiments of the present invention.

The present embodiments of FIGS. 9 to 13 are similar to the embodiments of FIGS. 1 to 3 and 6 to 8, with the exception of a difference in the forming method of the first doped layer. Thus, a description of the overlapping technical features will be omitted for conciseness.

Figure 9:
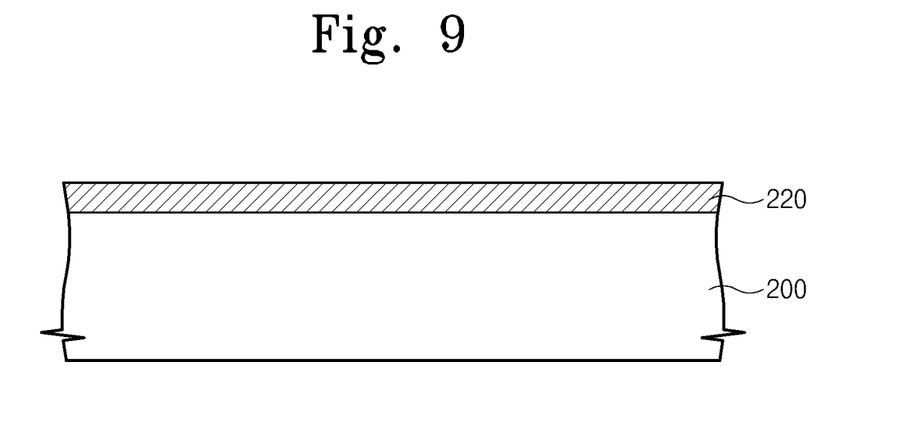
FIGS. 9 to 13 are cross-sectional views illustrating a method of fabricating a germanium photodetector according to other exemplary embodiments of the present invention.

Referring to FIG. 9, an amorphous germanium first doped layer 220 is formed on a substrate 200. To this end, for example, GeH$_4$ gas is introduced to the substrate 200. Herein, the substrate 200 may maintain a low temperature of about 300° C. to about 500° C. under a pressure of about 1 torr to about 300 torr. The GeH$_4$ gas is decomposed into germanium and H$_2$ gas, and the germanium is deposited onto the substrate 200 to form a germanium layer with a very small thickness of about 300 nm or less. The very small thickness can be achieved because the deposition rate is low. Due to the low substrate temperature, the germanium layer grows into an amorphous state on the substrate 200. The amorphous germanium layer is doped with n-type or p-type impurities in situ through an ion implantation or diffusion process during the formation thereof, to form the amorphous germanium first doped layer 220. For example, the first doped layer 220 may have a doping concentration of about $5\times10^{20}$/cm$^3$.

Figure 10:
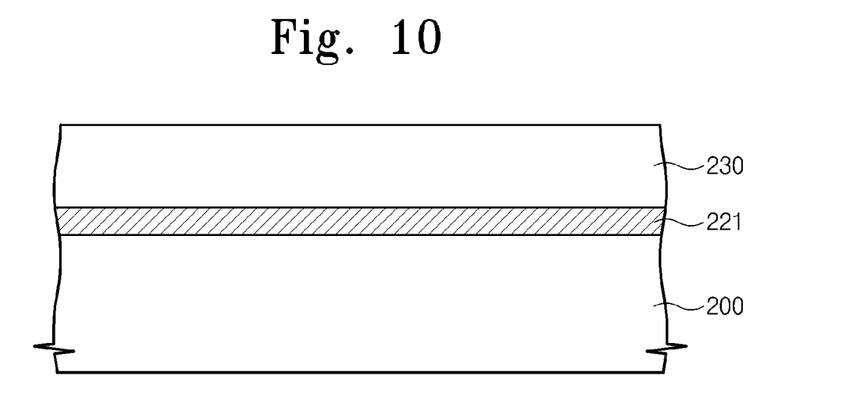

Referring to FIG. 10, the substrate 200 and amorphous germanium first doped layer 220 are heated up to a high temperature of about 600° C. to about 700° C. During the heating process, at least a portion of the amorphous germanium first doped layer 220 may be crystallized to form a crystallized germanium first doped layer 221. During or after the heating process, reaction gas GeH$_4$ is introduced onto the substrate 200 to form a germanium epitaxial layer 230. The crystallization and the growth of the germanium epitaxial layer 230 may be performed under a pressure of about 1 torr to about 300 torr. The resulting germanium epitaxial layer 230 reduces a stress due to a lattice constant difference with the substrate 200, thus making it possible to omit a additional buffer layer or a additional annealing process. Accordingly, the germanium epitaxial layer 230 deposited on the crystallized germanium first doped layer 221 can grow epitaxially due to the homogeneous elements. Consequently, it is possible to reduce lattice defects due to a lattice constant difference between the germanium epitaxial layer 230 and the substrate 200.

Figure 11:
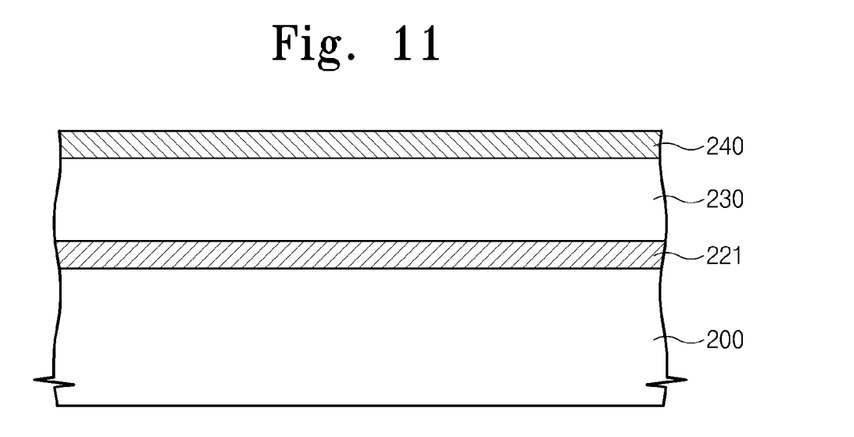

Referring to FIG. 11, a second doped layer 240 is formed on the germanium epitaxial layer 230. In an embodiment, the second doped layer 240 may be formed by introducing n-type or p-type impurity elements to the germanium epitaxial layer 230. In another embodiment, the second doped layer 240 may be formed by depositing n-type or p-type doped silicon or polysilicon on the germanium epitaxial layer 230. For example, the second doped layer 240 may have a doping concentration of about $1\times10^{19}$/cm$^3$. The second doped layer 240 has a different conductivity type from the crystallized germanium first doped layer 221, thus forming a p-i-n detector.

Figure 12:
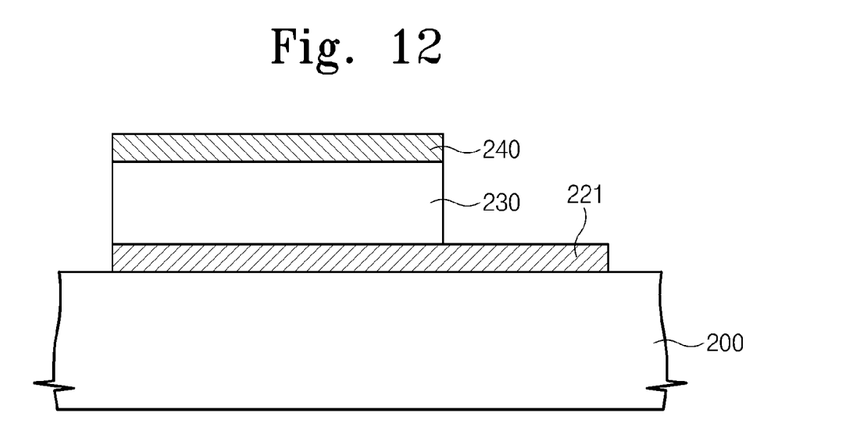
Figure 13:
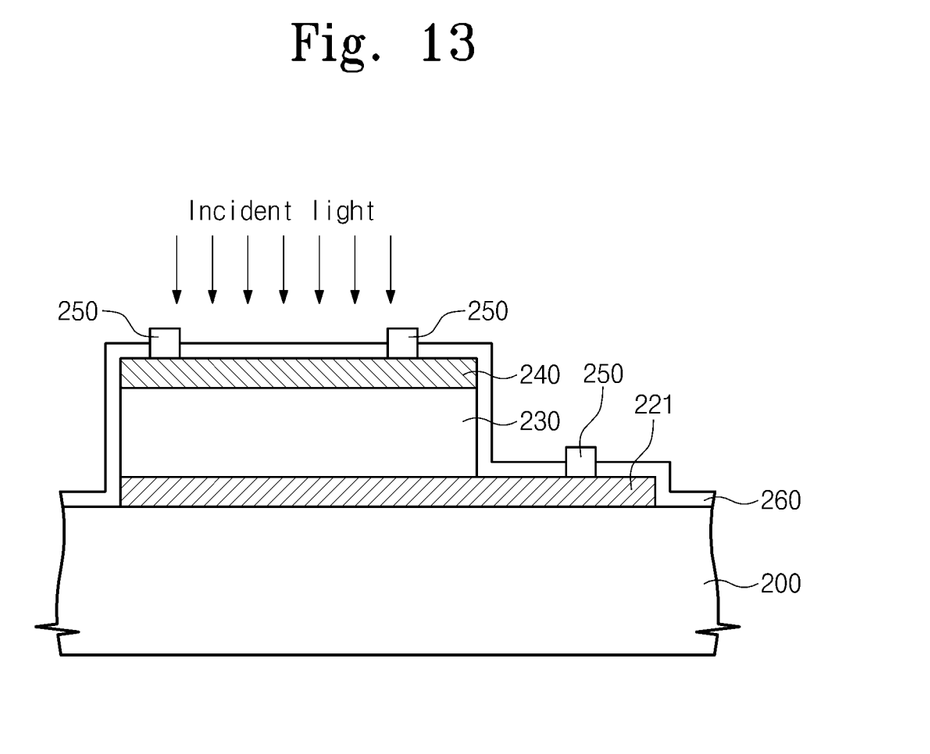

Referring to FIGS. 12 and 13, the crystallized germanium first doped layer 221, the germanium epitaxial layer 230, and the second doped layer 240 are anisotropically etched and patterned to expose the crystallized germanium first doped layer 221. An insulating passivation layer 260 is formed on the resulting structure. The insulating passivation layer 260 may be formed of an oxide, a nitride, or a nitric oxide. A portion of the insulating passivation layer 260 is etched to expose the crystallized germanium first doped layer 221 and the second doped layer 240. An electrode 250 is formed on the exposed portion.

Figure 14:
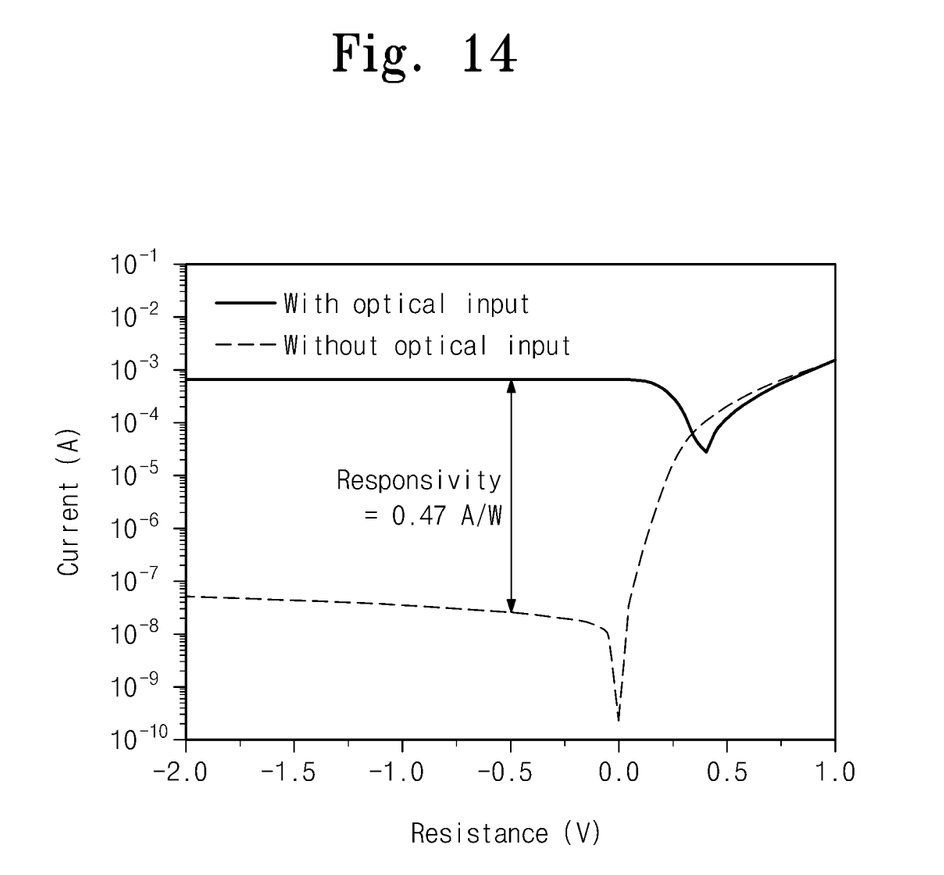
FIG. 14 is a graph illustrating the current-voltage characteristics of a germanium photodetector according to exemplary embodiments of the present invention.

FIG. 14 is a graph illustrating the current-voltage characteristics of a germanium photodetector according to exemplary embodiments of the present invention. An photocurrent with a responsivity of about 0.47 A/W is flat over a wide range of reverse bias voltage, and a leakage current is about 30 nA at about −0.5 V. Also, a nearly full DC responsivity was obtained even at 0 V. This means that an electric field is formed sufficiently to the extent that it is formed in a depletion region even without bias. Up to an optical power of about 5 mW, no compression of a DC photocurrent was observed.

Figure 15:
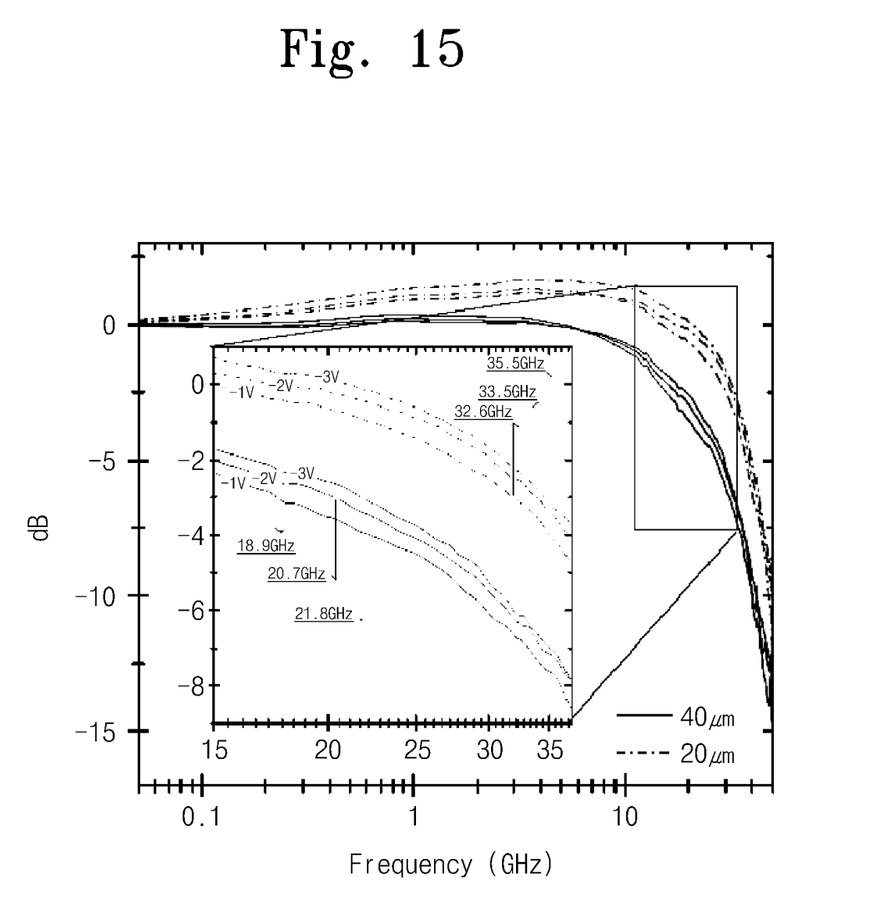
FIG. 15 is a graph illustrating the bit rate of a germanium photodetector according to exemplary embodiments of the present invention.

FIG. 15 is a graph illustrating the bit rate of a germanium photodetector according to exemplary embodiments of the present invention. The speed of the germanium photodetector was measured using an impulse response measurement for the detector with diameter of about 20 μm to about 40 μm. Mode-locked pulses of a Digital Communication Analyzer with a center wavelength of about 1550 nm are coupled into the detector of −1 V, −2 V and −3 V. The shape of an temporal response of the detector was mostly Gaussian with a hillock-shaped at the tail. Fourier transform of the measured pulse was performed to obtain the frequency spectrum of FIG. 15. A resulting bandwidth of about 3-dB for 35 GHz shows that the detector can afford a bit rate up to 50 Gb/s.

As described above, the present invention forms a germanium epitaxial layer in a low vacuum without the use of a buffer layer and an annealing process, thereby making it possible to provide a germanium photodetector that is relatively low in substrate/process costs.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a germanium photodetector, the method comprising:
   forming an amorphous germanium layer on a silicon substrate at a first temperature;
   crystallizing the amorphous germanium layer while heating from the first temperature to a second temperature; and
   forming a germanium epitaxial layer on the crystallized germanium layer,
   wherein impurity atoms are doped in situ during the forming of the amorphous germanium layer.

2. The method of claim 1, wherein the forming of the germanium epitaxial layer on the crystallized germanium layer is performed at the second temperature, or during the heating from the first temperature to the second temperature.

3. The method of claim 1, wherein the first temperature is about 300° C. to about 500° C.

4. The method of claim 3, wherein the second temperature is about 600° C. to about 700° C.

5. The method of claim 1, wherein the forming of the amorphous germanium layer and the germanium epitaxial layer is performed in a low vacuum of about 1 torr to about 300 torr.

6. The method of claim 1, wherein the amorphous germanium layer is formed to a thickness of about 300 nm or less.

7. The method of claim 1, wherein the amorphous germanium layer and the crystallized germanium layer are substantially free from silicon atoms.

8. The method of claim 1, wherein the germanium epitaxial layer is substantially free from silicon atoms.

9. A method of fabricating a germanium photodetector, the method comprising:
   forming an amorphous germanium layer on a silicon substrate at a first temperature;
   crystallizing the amorphous germanium layer while heating from the first temperature to a second temperature; and
   forming a germanium epitaxial layer on the crystallized germanium layer,
   wherein forming the germanium epitaxial layer is an annealing-free process.

10. A method of fabricating a germanium photodetector, the method comprising:
    forming an amorphous germanium layer on a silicon substrate at a first temperature; and
    forming a germanium epitaxial layer on the amorphous germanium layer at a second temperature, or during the heating from the first temperature to the second temperature;
    wherein the amorphous germanium layer is crystallized during the forming of the germanium epitaxial layer, and
    wherein forming the germanium epitaxial layer is an annealing-free process.

11. The method of claim 10, wherein the first temperature is about 300° C. to about 500° C.

12. The method of claim 10, wherein the second temperature is about 600° C. to about 700° C.

13. The method of claim 10, wherein the forming of the amorphous germanium layer and the germanium epitaxial layer is performed in a low vacuum of about 1 torr to about 300 torr.

14. The method of claim 10, wherein the amorphous germanium layer is formed to a thickness of about 300 nm or less.

15. The method of claim 10, wherein the amorphous germanium layer and the crystallized germanium layer are substantially free from silicon atoms.

16. The method of claim 10, wherein the germanium epitaxial layer is substantially free from silicon atoms.

* * * * *